US008634233B2

(12) United States Patent
Lilja et al.

(10) Patent No.: US 8,634,233 B2
(45) Date of Patent: Jan. 21, 2014

(54) SYSTEMS AND METHODS FOR DIRECT COMMUNICATION BETWEEN MAGNETIC TUNNEL JUNCTIONS

(75) Inventors: David J. Lilja, Maplewood, MN (US); Jian-Ping Wang, Shoreview, MN (US); Andrew P. Lyle, Boise, ID (US); Shruti R. Patil, Santa Clara, CA (US); Jonathan D. Harms, Hopkins, MN (US); Xiaofeng Yao, San Jose, CA (US)

(73) Assignee: Regents of the University of Minnesota, Minneapolis, MN (US)

( * ) Notice: Subject to any disclaimer, the term of this patent is extended or adjusted under 35 U.S.C. 154(b) by 60 days.

(21) Appl. No.: 13/475,544

(22) Filed: May 18, 2012

(65) Prior Publication Data

US 2012/0314489 A1    Dec. 13, 2012

Related U.S. Application Data

(60) Provisional application No. 61/487,761, filed on May 19, 2011.

(51) Int. Cl.
*G11C 11/16* (2006.01)

(52) U.S. Cl.
USPC ............................ 365/158; 365/148; 977/935

(58) Field of Classification Search
USPC .................................. 365/5, 8; 977/934, 935
See application file for complete search history.

(56) References Cited

U.S. PATENT DOCUMENTS 7,154,798 B2 * 12/2006 Lin et al. ...................... 365/209
7,508,700 B2 *  3/2009 Zhong et al. ................. 365/158
8,295,082 B2 * 10/2012 Chua-Eoan et al. .......... 365/171

OTHER PUBLICATIONS

Meng et al., A Spintronics Full Adder for Magnetic CPU, IEEE Electron Device Letters, vol. 26, No. 6, Jun. 2005, pp. 360-362.
Harms et al., SPICE Macromodel of Spin-Torque-Transfer-Operated Magnetic Tunnel Junctions, IEEE Transactions on Electron Devices, vol. 57, No. 6, Jun. 2010, pp. 1425-1430.
Lyle et al., Communication Between Magnetic Tunnel Junctions Using Spin-Polarized Current for Logic Applications, IEEE Transaction on Magnetics, vol. 46, No. 6, Jun. 2010, pp. 2216-2219.
Lyle et al., Direct Communication Between Magnetic Tunnel Junctions for Nonvolatile Logic Fan-Out Architecture, Applied Physics Letters 97, 2010, pp. 152504-1 to 152504-3.

* cited by examiner

*Primary Examiner* — Tan T. Nguyen
(74) *Attorney, Agent, or Firm* — Westman, Champlin & Koehler, P.A.; Theodore M. Magee

(57) ABSTRACT

Systems and methods that enable direct communications between magnetic tunnel junctions are provided. In one embodiment, a device includes multiple input magnetic tunnel junctions and an output magnetic tunnel junction. The multiple input magnetic tunnel junctions are connected in parallel, and the output magnetic tunnel junction is connected in series to the input magnetic tunnel junctions. In another embodiment, a device includes a first magnetic tunnel junction, a second magnetic tunnel junction, and a nano-magnetic channel. Each of the first and the second magnetic tunnel junctions has a free layer, a nonmagnetic layer, and a fixed layer. The nano-magnetic channel connects the free layer of the first magnetic tunnel junction to the free layer of the second magnetic tunnel junction.

22 Claims, 17 Drawing Sheets

| Inputs | | MTJ 130 Output | | | |
|---|---|---|---|---|---|
| MTJ 110 | MTJ 120 | AND | OR | NAND | NOR |
| 0 | 0 | 0 | 0 | 1 | 1 |
| 0 | 1 | 0 | 1 | 1 | 0 |
| 1 | 0 | 0 | 1 | 1 | 0 |
| 1 | 1 | 1 | 1 | 0 | 0 |
| Preset State of MTJ 130 | | 1 | 1 | 0 | 0 |
| Example $V_{MTJ}$ | | -2.1 V | -1.8 V | 2.1 V | 1.8 V |

Fig. 2

| Function | Inputs to Terminals | | | Net Current | Output MTJ Resistance | |
|---|---|---|---|---|---|---|
| | 714 | 716 | 718 | | | |
| OR | +I (1) | +I (1) | +I (1) | +3I | High (1) | 851 |
| | -I (0) | +I (1) | +I (1) | +I | High (1) | 852 |
| | +I (1) | -I (0) | +I (1) | +I | High (1) | 853 |
| | -I (0) | -I (0) | +I (1) | -I | Low (0) | 854 |
| AND | +I (1) | +I (1) | -I (0) | +I | High (1) | 855 |
| | -I (0) | +I (1) | -I (0) | -I | Low (0) | 856 |
| | +I (1) | -I (0) | -I (0) | -I | Low (0) | 857 |
| | -I (0) | -I (0) | -I (0) | -3I | Low (0) | 858 |

Fig. 8

|  | A | B | C | $M_1-M_1'$ | $M_2-M_2'$ | $M_3-M_3'$ | $M_4-M_4'$ | $M_5-M_5'$ |
|---|---|---|---|---|---|---|---|---|
| 1622 — SUM | 1/0 | 1/0 | 1/0 | 1 | 0 | 0 | 0 | 0 |
| 1624 — DIFF | 1/0 | 1/0 | 1/0 | 1 | 0 | 0 | 0 | 0 |
| 1626 — CARRY | 1/0 | 1/0 | 1/0 | 0 | 1 | 0 | 0 | 0 |
| 1628 — BORROW | 1/0 | 1/0 | 1/0 | 0 | 0 | 1 | 0 | 0 |
| 1630 — AND | 1/0 | 1/0 | 0 | 0 | 0 | 0 | 1 | 0 |
| 1632 — OR | 1/0 | 1/0 | 1 | 0 | 0 | 0 | 1 | 0 |
| 1634 — NAND | 1/0 | 1/0 | 0 | 0 | 0 | 0 | 0 | 1 |
| 1636 — NOR | 1/0 | 1/0 | 1 | 0 | 0 | 0 | 0 | 1 |
| 1638 — XOR | 1/0 | 1/0 | 0 | 1 | 0 | 0 | 0 | 0 |
| 1640 — XNOR | 1/0 | 1/0 | 1 | 1 | 0 | 0 | 0 | 0 |

Column headers: 1602, 1604, 1606, 1608, 1610, 1612, 1614, 1616, 1618

SYSTEMS AND METHODS FOR DIRECT COMMUNICATION BETWEEN MAGNETIC TUNNEL JUNCTIONS

REFERENCE TO RELATED CASE

The present application is based on and claims the priority of provisional application Ser. No. 61/487,761 filed on May 19, 2011, the contents of which are hereby incorporated by reference in their entirety.

STATEMENT OF GOVERNMENT INTEREST

This invention was made with government support under ECCS-0702264 and DMR-0819885 awarded by the National Science Foundation. The government has certain rights in the invention.

BACKGROUND

A magnetic tunnel junction (MTJ) includes two magnetic layers separated by a nonmagnetic layer. The electrical resistance across the MTJ depends on the relative magnetic orientations of the two magnetic layers. When the relative magnetic orientation of the two layers is parallel, the MTJ has a low resistance. When the relative magnetic orientation of the two layers is antiparallel, the MTJ has a high resistance. One of the magnetic layers is generally fixed by antiferromagnetically coupling it with a pinning layer. Consequently, the fixed magnetic layer has a high coercivity and does not change orientation under normal operation. However, the other layer, with a lower coercivity, may change orientation. The orientation of the magnetic free layer can be controlled by using an external magnetic field, or by using spin-torque-transfer (STT) switching.

MTJs have been used to create memory devices and logic devices. However, the devices have included intermediate circuitry to read data from and write data to the MTJs. For example, in some devices, additional CMOS components have been used to read the resistance states of MTJs at each stage of circuitry, and then to convert the resistance states into voltages or currents. This intermediate circuitry can add integration complexity, power consumption, area, and delay overheads, and hence should be minimized to gain full advantage of MTJ technology.

SUMMARY

An aspect of the disclosure relates to systems and methods that enable direct communications between magnetic tunnel junctions. In one embodiment, a device includes multiple input magnetic tunnel junctions and an output magnetic tunnel junction. The multiple input magnetic tunnel junctions are connected in parallel, and the output magnetic tunnel junction is connected in series to the input magnetic tunnel junctions.

In another embodiment, a device includes a first magnetic tunnel junction, a second magnetic tunnel junction, and a nano-magnetic channel. Each of the first and the second magnetic tunnel junctions has a free layer, a nonmagnetic layer, and a fixed layer. The nano-magnetic channel connects the free layer of the first magnetic tunnel junction to the free layer of the second magnetic tunnel junction.

These and various other features and advantages that characterize the claimed embodiments will become apparent upon reading the following detailed description and upon reviewing the associated drawings.

BRIEF DESCRIPTION OF THE DRAWINGS

FIG. 2 is a table that illustrates logic functions that can be performed utilizing the two-input logic device in FIG. 1.
FIG. 8 is a table that illustrates logic functions that can be performed utilizing the one MTJ logic device in FIG. 7.
FIG. 16 is table that illustrates the settings of the inputs and control signals for operating the arithmetic logic unit in FIG. 15.

DETAILED DESCRIPTION

Embodiments of the present disclosure include systems and methods for direct communication between magnetic tunnel junctions (MTJs). In a first embodiment, two or three MTJs are connected in parallel, and the output of the two or three MTJs is directly connected in series to another MTJ. In a second embodiment, MTJs are directly connected utilizing a nano-magnetic channel. Accordingly, embodiments enable MTJs to communicate directly without the need for intermediate circuitry such as sensing amplifiers. This may help reduce integration complexity, power consumption, area, and delay overheads in MTJ devices. Embodiments may also provide other benefits such as, but not limited to, providing non-volatile memory, combining logic and memory functions in one circuit, and simplifying fabrication. These and various other features and advantages are described in greater detail below.

Figure 1:
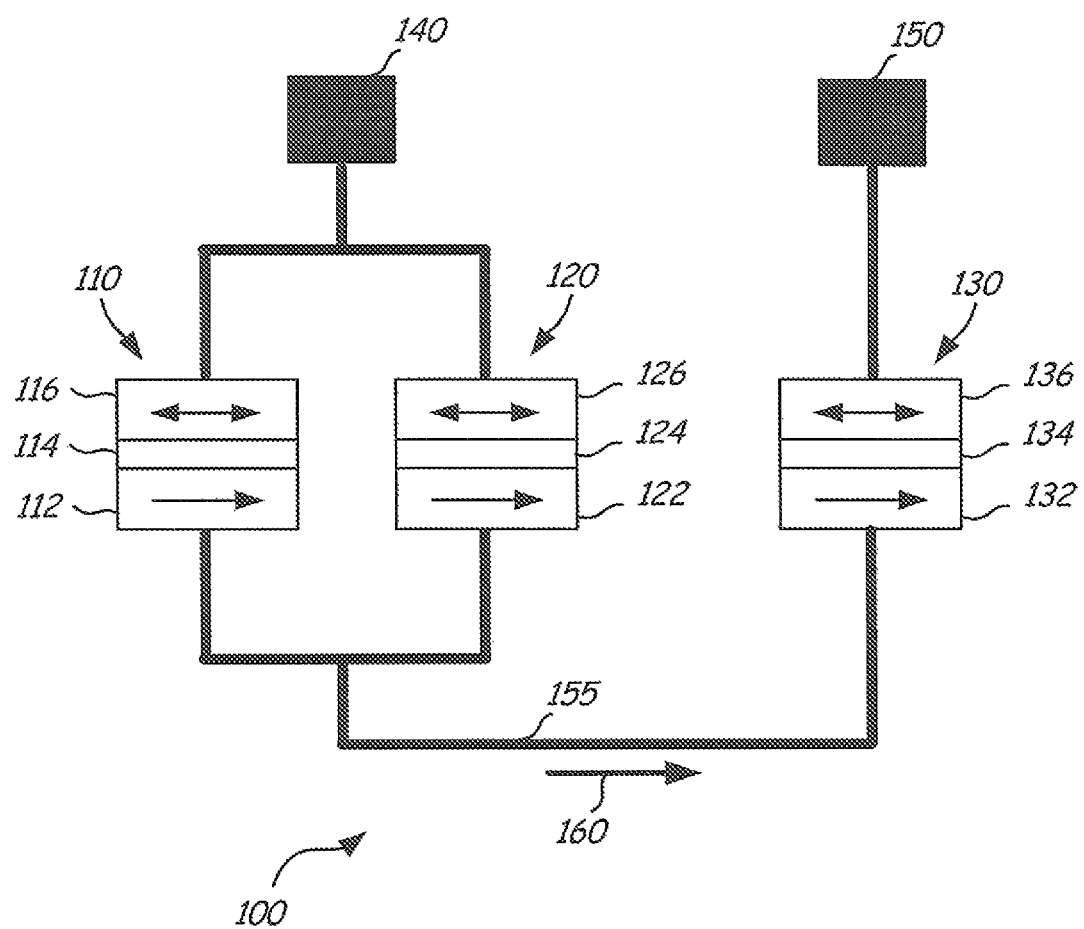
FIG. 1 is a schematic diagram of a two-input logic device.

FIG. 1 is a schematic diagram of a two-input logic device 100. Device 100 includes a first input MTJ 110, a second input MTJ 120, and an output MTJ 130. MTJs 110 and 120 are connected in parallel, and MTJ 130 is connected in series to the output of MTJs 110 and 120. Additionally, a first electrode 140 is connected to MTJs 110 and 120, a second electrode 150 is connected to MTJ 130, and a third electrode 155 connects MTJs 110, 120, and 130. A voltage can be applied across device 100 utilizing electrodes 140, 150, and 155. In one particular embodiment, a bias voltage, $V_{MTJ}$, is connected to electrode 140, and an electrical ground is connected to electrode 150.

MTJ 110 includes a fixed layer 112, a nonmagnetic layer 114, and a free layer 116. When the relative magnetic orientation of layers 112 and 116 is parallel, MTJ 110 has a low resistance. When the relative magnetic orientation of layers 112 and 116 is antiparallel, MTJ 110 has a high resistance. In certain embodiments, MTJ 110 corresponds to a logic state-0 when the resistance is low, and corresponds to a logic state-1 when the resistance is high. Furthermore, the magnetic orientation of free layer 116 can be controlled by using an external magnetic field, or by using spin-torque-transfer (STT) switching. For example, CMOS components could be added to device 100 to individually set the logic states of the MTJs using STT switching.

Similar to MTJ 110, MTJ 120 includes a fixed layer 122, a nonmagnetic layer 124, and a free layer 126, and MTJ 130 includes a fixed layer 132, a nonmagnetic layer 134, and a free layer 136. Also, the magnetic orientations of free layers 126 and 136 can be set using external magnetic fields or STT switching, and MTJs 120 and 130 can correspond to either a logic state-0 or logic state-1 depending upon the resistance. Additionally, the other MTJs described in this disclosure can be assumed to behave in the same or similar manner as MTJs 110, 120, and 130.

When a bias voltage is applied across device 100 (e.g. by utilizing electrodes 140 and 150), an electric current 160 is generated that flows through MTJ 130. The electric current, I, can be calculated utilizing equation 1 below.

$$I = \frac{V_{MTJ}}{\frac{R_{110} \cdot R_{120}}{R_{110} + R_{120}} + R_{130}} \quad \text{Equation 1}$$

Where $V_{MTJ}$ is the bias voltage across electrodes 140 and 150, $R_{110}$ is the resistance of MTJ 110, $R_{120}$ is the resistance of MTJ 120, and $R_{130}$ is the resistance of MTJ 130.

In an embodiment, MTJ 130 is associated with one or more threshold current values. For example, if electric current 160 is larger than or equal to the threshold current, MTJ 130 will either be maintained at or be switched to a high resistance (e.g. logic state-1). If a reverse current is applied that is larger than or equal to the threshold current, MTJ 130 will either be maintained at or be switch to a low resistance (e.g. logic state-0).

FIG. 2 is a table 200 that illustrates logic functions that can be performed utilizing device 100. Column 202 shows logic states for the first input MTJ 110, and column 204 shows logic states for the second input MTJ 120. Row 206 shows preset logic states for the output MTJ 130, and row 208 shows example bias voltages, $V_{MTJ}$. Bias voltages 208 are dependent upon the particular details of the fabrication of the device. Embodiments of the present disclosure are not limited to any particular bias voltages, and can include any bias voltages. The specific examples shown in FIG. 2 are given for illustration purposes only. Additionally, it should be noted that the bias voltages applied to the output MTJ 130 may be manipulated by changing the wiring of the device. For example, FIG. 1 shows current 160 entering the output MTJ 130 from the fixed layer 132, and exiting from the free layer 136. In another embodiment, device 100 is wired such that current 160 enters the output MTJ 130 from the free layer 136, and exits from the fixed layer 132.

As can be seen in rows 206 and 208 of FIG. 2, the AND function is illustratively performed by presetting the state of MTJ 130 to a high resistance/logic state-1, and applying a bias voltage of −2.1 volts. Column 210 shows the resulting state of the output MTJ 130 when performing the AND function. When either one or both of the input MTJs 110 and 120 has a low resistance/logic state-0 (shown in columns 202 and 204), the electric current (e.g. current 160 in FIG. 1) that flows through the output MTJ 130 exceeds the threshold current such that the output MTJ 130 is switched from a high resistance/logic state-1 to a low resistance/logic state-0. However, when both of the input MTJs 110 and 120 have a high resistance/logic state-1, the electric current that flows through the output MTJ 130 does not exceed the threshold current, and the output MTJ 130 stays at its preset high resistance/logic state-1.

The OR function is illustratively performed by presetting the state of MTJ 130 to a high resistance/logic state-1, and applying a bias voltage of −1.8 volts. Column 212 shows the resulting state of the output MTJ 130 when performing the OR function. When either one or both of the input MTJs 110 and 120 has a high resistance/logic state-1, the electric current that flows through the output MTJ 130 does not exceed the threshold current, and the output MTJ stays at its preset high resistance/logic state-1. However, when both of the input MTJs 110 and 120 have a low resistance/logic state-0, the electric current that flows through the output MTJ 130 exceeds the threshold current such that the output MTJ 130 is switched from a high resistance/logic state-1 to a low resistance/logic state-0.

The NAND function is illustratively performed by presetting the state of MTJ 130 to a low resistance/logic state-0, and applying a bias voltage of 2.1 volts. Column 214 shows the resulting state of the output MTJ 130 when performing the NAND function. When either one or both the input MTJs 110 and 120 has a low resistance/logic state-0, the electric current that flows through the output MTJ 130 exceeds the threshold current such that the output MTJ 130 is switched from the low resistance/logic state-0 to a high resistance/logic state-1. However, when both of the input MTJs 110 and 120 have high resistances/logic state-1, the electric current that flows through the output MTJ 130 does not exceed the threshold current, and the output MTJ 130 stays at its preset low resistance/logic state-0.

The NOR function is illustratively performed by presetting the state of the MTJ 130 to a low resistance/logic state-0, and applying a bias voltage of 1.8 volts. Column 216 shows the resulting state of the output MTJ 130 when performing the NOR function. When either one or both of the input MTJs 110 and 120 has a high resistance/logic state-1, the electric current that flows through the output MTJ 130 does not exceed the threshold current, and the output MTJ stays at its preset low resistance/logic state-0. However, when both of the input MTJs 110 and 120 have low resistances/logic state-0, the current that flows through output MTJ 130 exceeds the threshold current such that the output MTJ 130 is switched from the low resistance/logic state-0 to a high resistance/logic state-1.

Figure 3:
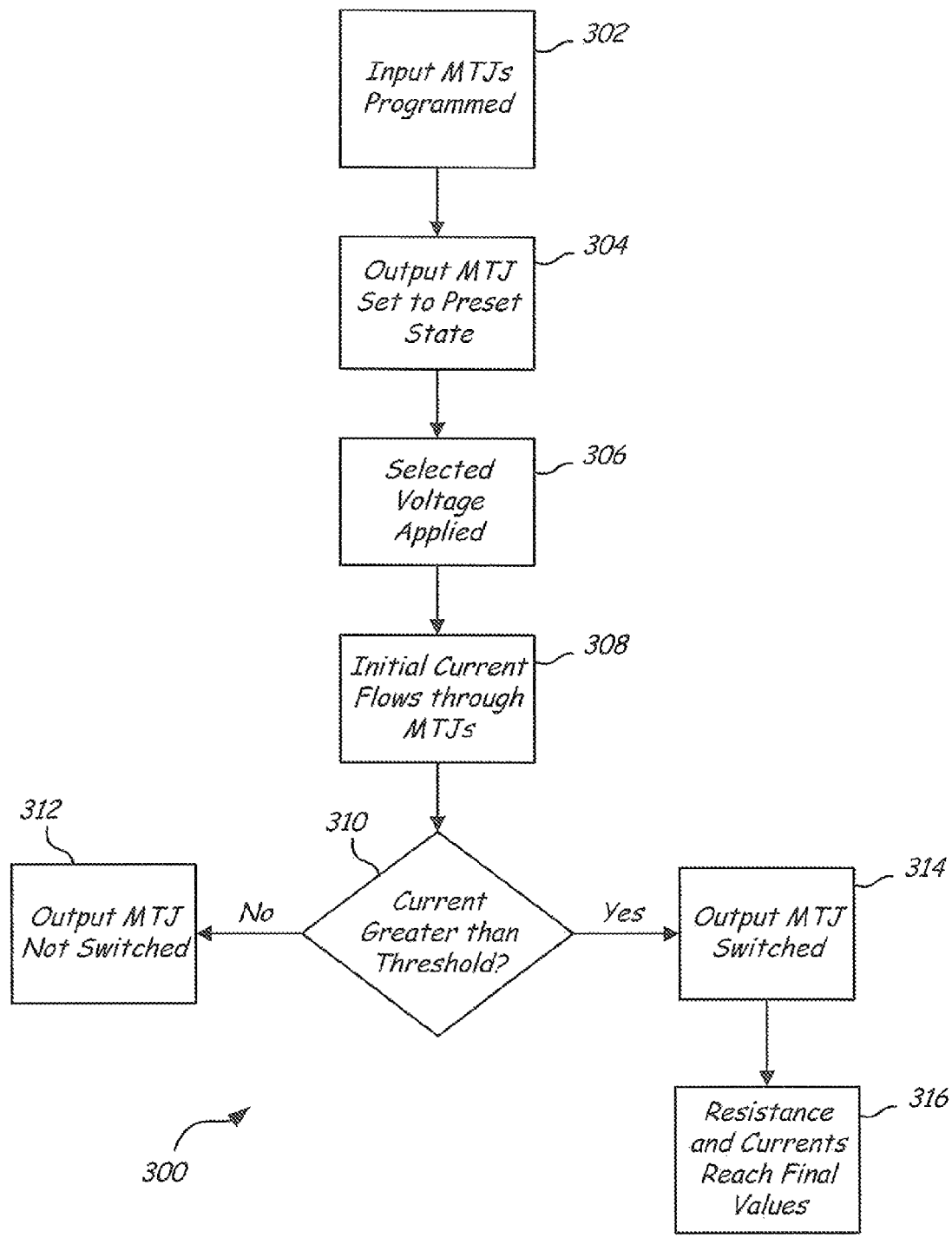
FIG. 3 is a process flow diagram of a method of utilizing the two-input logic device in FIG. 1 to perform logic functions.

FIG. 3 is a process flow diagram of a method 300 of utilizing a MTJ device (e.g. device 100 in FIG. 1) to perform logic functions. At block 302, each of the input MTJs (e.g. MTJs 110 and 120 in FIG. 1) is programmed to a low resistance/logic state-0 or to a high resistance/logic state-1. At block 304, the output MTJ (e.g. MTJ 130 in FIG. 1) is set to a preset value (i.e. either low resistance/logic state-0 or high resistance/logic state-1), and at block 306, a selected bias voltage is applied. As was described above, the preset value of the output MTJ and the bias voltage are illustratively determined based on what logic function is to be performed.

At block 308, an initial current flows through the MTJs. The initial current can be calculated utilizing equation 1 above with $R_{110}$, $R_{120}$, and $R_{130}$ being the initial resistance values of MTJs 110, 120, and 130, respectively. At block 310, it is determined whether the initial current is greater than the threshold current needed to switch the magnetic orientation of the free layer of the output MTJ. If the initial current is not greater than the threshold current, then at block 312, the resistance/logic state of the output MTJ is not switched. If the initial current is greater than the threshold current, then at block 314, the resistance/logic state of the output MTJ is switched. Finally, at block 316, if the output MTJ has switched, the overall resistance of the device and the currents reach their final values, which are different than the initial values. In certain embodiments, there may be a time delay associated with the resistances and currents reaching their final values. These delays can be modified for example by changing properties of the MTJs or the bias voltage (e.g. a higher bias voltage may reduce the delay time).

In light of the above, it can be seen that the MTJ device 100 in FIG. 1 can be used to perform AND, OR, NAND, and NOR functions. The particular function to be performed can be selected by using an appropriate bias voltage, and presetting the output MTJ to either a low resistance/logic state-0 or a high resistance/logic state-1. It is worth highlighting that no intermediate circuitry (e.g. CMOS) is needed to communicate between the input MTJs (e.g. MTJs 110 and 120 in FIG. 1) and the output MTJ (e.g. MTJ 130 in FIG. 1). Instead, the MTJs communicate directly with each other. Additionally, it is also worth highlighting that device 100 can be viewed as a combined logic-and-memory device. The input MTJs can be considered memory devices that store data in a non-volatile way, while the output MTJs can be considered logic devices that compute logic functions for the data. Therefore, device 100 allows for the incorporation of memory and logic in one device. With such combined devices, overheads and complexity of communication between processor and memory may be reduced, leading to faster processing with lower power consumption.

Figure 4:
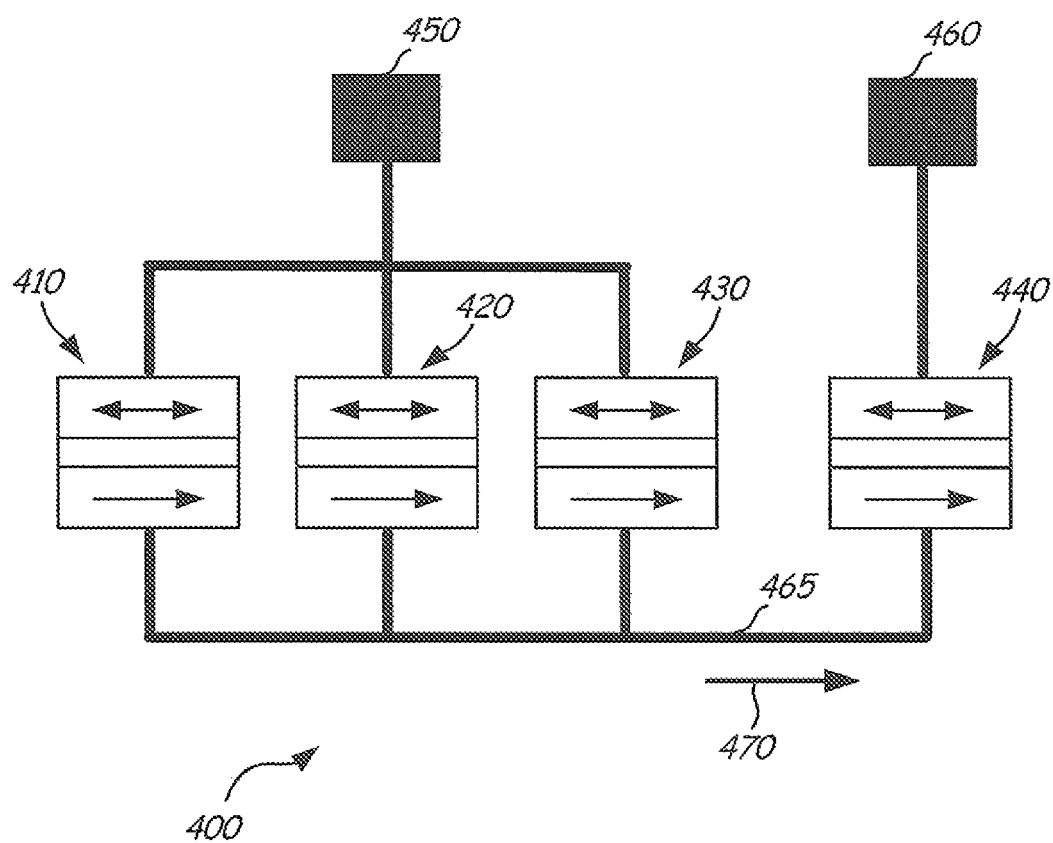
FIG. 4 is a schematic diagram of a three-input logic device.

FIG. 4 is a schematic diagram of a three-input logic device 400. Device 400 includes three input MTJs 410, 420, and 430, and one output MTJ 440. The three input MTJs 410, 420, and 430 are connected in parallel, and the output MTJ 440 is connected in series to the output of the input MTJs. A first electrode 450 is connected to the input MTJs 410, 420, and 430, a second electrode 460 is connected to MTJ 440, and a third electrode 465 connects MTJs 410, 420, 430, and 440. A voltage (e.g. a bias voltage, $V_{MTJ}$) can be applied across device 400 utilizing electrodes 450, 460, and 465. The electric current 470 that flows through MTJ 440 can be calculated utilizing equation 2 below.

$$I = \frac{V_{MTJ}}{\frac{R_{410} \cdot R_{420} \cdot R_{430}}{R_{410} \cdot R_{420} + R_{410} \cdot R_{430} + R_{420} \cdot R_{430}} + R_{440}} \quad \text{Equation 2}$$

Where $V_{MTJ}$ is the bias voltage across electrodes 450 and 460, $R_{410}$ is the resistance of MTJ 410, $R_{420}$ is the resistance of MTJ 420, $R_{430}$ is the resistance of MTJ 430, and $R_{440}$ is the resistance of MTJ 440. In an embodiment, MTJ 440 is associated with one or more threshold current values such that the magnetic orientation of the free layer of MTJ 440 can be controlled utilizing electric current 470 to perform STT switching. Additionally, the wiring of device 400 is not limited to the specific embodiment shown in the figure. For example, device 400 can be wired such that electric current 470 enters the output MTJ 440 from either its fixed layer side or from its free layer side.

Device 400 illustratively has many of the same features and/or benefits as device 100 in FIG. 1. For example, device 400 is able to store data in its input MTJs, and then perform a logic function on the data utilizing its output MTJ. Device 400 may also provide other benefits. For instance, in addition to being able to perform AND, OR, NAND, and NOR logic functions, device 400 is also able to perform the majority function. Furthermore, instead of only being able to store data in two input MTJs, device 400 is able to store data in three input MTJs. It should be noted however that embodiments of the present disclosure are not limited to the two and three input devices shown in FIGS. 1 and 4. Embodiments illustratively include any number of input MTJs, and are able to perform functions on all of the input MTJs to produce a value that is stored to an output MTJ.

Figure 5:
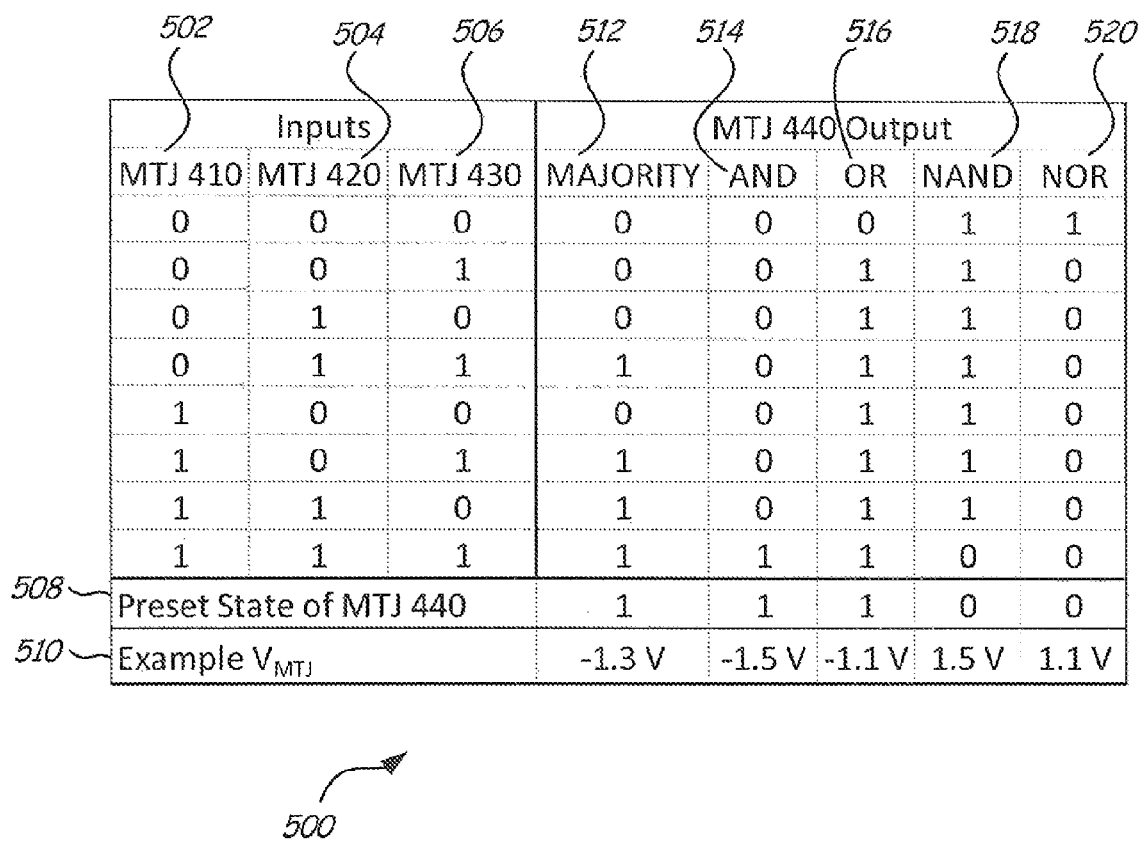
FIG. 5 is a table that illustrates logic functions that can be performed utilizing the three-input logic device in FIG. 4.

FIG. 5 has a table 500 that illustrates logic functions that can be performed utilizing device 400. Column 502 shows logic states for the first input MTJ 410, column 504 shows logic states for the second input MTJ 420, and column 506 shows logic states for the third input MTJ 430. Row 508 shows preset logic states for the output MTJ 440, and row 510 shows example bias voltages, $V_{MTJ}$. Again, bias voltages 510 are dependent upon the particular details of the device (e.g. the fabrication and wiring of the device). The values given in FIG. 5 are given for illustration purposes only, and embodiments of the present disclosure can include any bias voltages.

As can be seen in FIG. 5, the majority function is illustratively performed by presetting the state of MTJ 440 to a high resistance/logic state-1, and applying a bias voltage of −1.3 volts. Column 512 shows the resulting state of the output MTJ 440 when performing the majority function. When two or three of the input MTJs 410, 420, and 430 have low resistances/logic state-0, the electric current (e.g. current 470 in FIG. 4) that flows though the output MTJ 440 exceeds the threshold current such that the output MTJ 440 is switched from a high resistance/logic state-1 to a low resistance/logic state-0. However, when two or three of the input MTJs 410, 420, and 430 have high resistances/logic state-1, the electric current that flows through the output MTJ 440 does not exceed the threshold current, and the output MTJ 440 stays at its preset high resistance/logic state-1. Accordingly, device 400 can be used to perform the majority function.

The AND, OR, NAND, and NOR functions can be performed using a three-input device similar to how the functions are performed using the two-input device described above. Column 514 shows the resulting state of the output MTJ 440 when performing the AND function. Column 516 shows the resulting state of the output MTJ 440 when performing the OR function. Column 518 shows the resulting state of the output MTJ 440 when performing the NAND function, and column 520 shows the resulting state of the output MTJ 440 when performing the NOR function.

The ability of the three-input device to perform the majority function may be advantageous in certain circumstances. The majority function is a universal logic gate that can be utilized to realize any other logic function. The majority function is under developed in CMOS based logic since it cannot be efficiently realized. However, for MTJ, it is a natural function that can be realized as demonstrated above. The addition of the majority function to the other primitive Boolean operations offers the potential for fewer gates to be used for functions such as XOR and full adders, thus reducing the footprint and improving performance of complex circuitry.

Another characteristic of the two and three input devices that should be considered is the voltage swing at the output. The two-input device may show a larger change of resistance between input resistance states since fewer MTJs are connected in parallel. This allows the two-input device to have a larger voltage swing between input states. For example, for one particular MTJ fabrication, a voltage swing of 250-300 mV was observed for the closest input states for a two-input device, while a voltage swing of 50-200 mV was observed for the closest input states for a three-input device. However, it is worth noting that although a larger voltage swing may be desirable, the voltage swings associated with both the two and three input devices are still large enough to realize all of the Boolean primitives.

Figure 6:
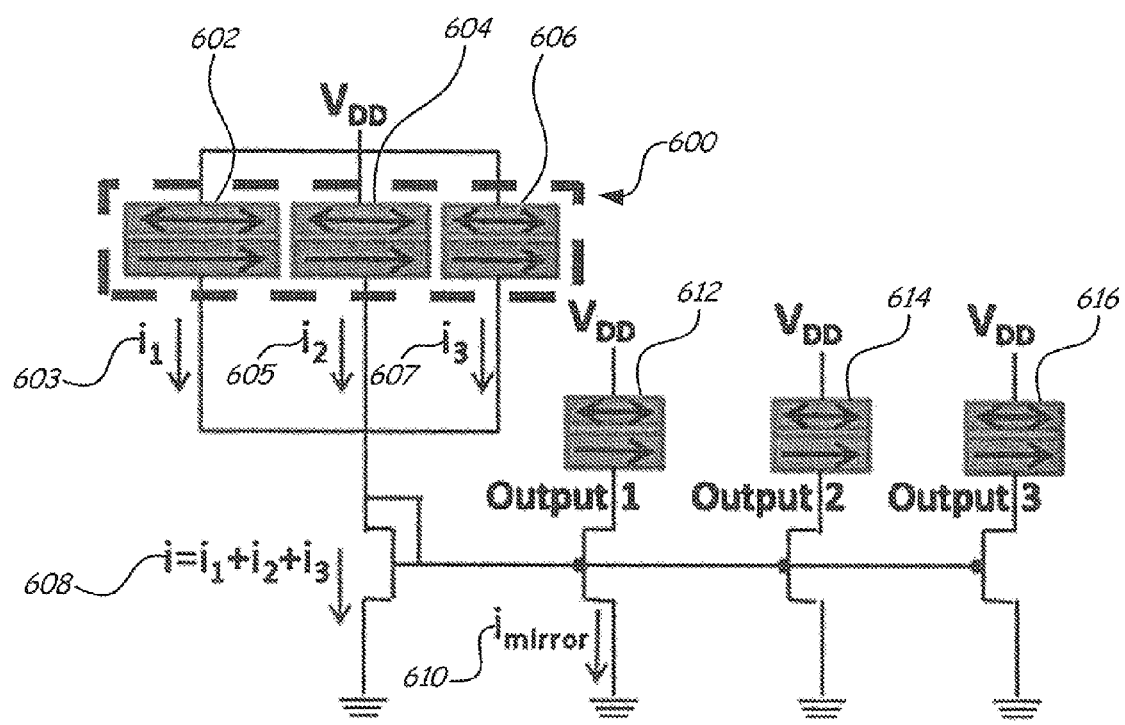
FIG. 6 is a schematic diagram of a MTJ device that utilizes a CMOS current mirror to fan-out to multiple output MTJs.

FIG. 6 is a schematic diagram of a MTJ device 600 that utilizes a CMOS current mirror to fan-out to multiple output MTJs. Device 600 illustratively includes three input MTJs 602, 604, and 606, and three output MTJs 612, 614, and 616. Embodiments are not however limited to any particular number of input and/or output MTJs, and embodiments can include any number of input and/or output MTJs.

During operation, a current 603 passes through MTJ 602, a current 605 passes through MTJ 604, and a current 607 passes through MTJ 606. The three branch currents combine to form a total output current 608 that is a sum of currents 603, 605, and 607. In an embodiment, a CMOS current mirror is utilized to generate a mirror current 610 based on current 608. In the particular example shown in the figure, the current mirror is used to output mirror current 610 to three output MTJs 612, 614, and 616. Again, embodiments are not however limited to any particular number of output MTJs, and current mirrors can be used to fan-out to any number of output MTJs.

As has been discussed above, some MTJ circuits have required CMOS to read the resistance states of MTJs at each stage of circuitry, and then convert the resistance states into voltages or currents that are passed to the next logic gate. These intermediate read and conversion steps may limit fan-out function, add integration complexity, power consumption, area, and delay overheads to logic modules. At least certain embodiments of the present disclosure do not need intermediary circuitry to read the resistance states of the MTJs at each stage. Accordingly, it may be more feasible to fan-out to multiple outputs as is shown in FIG. 6.

Figure 7:
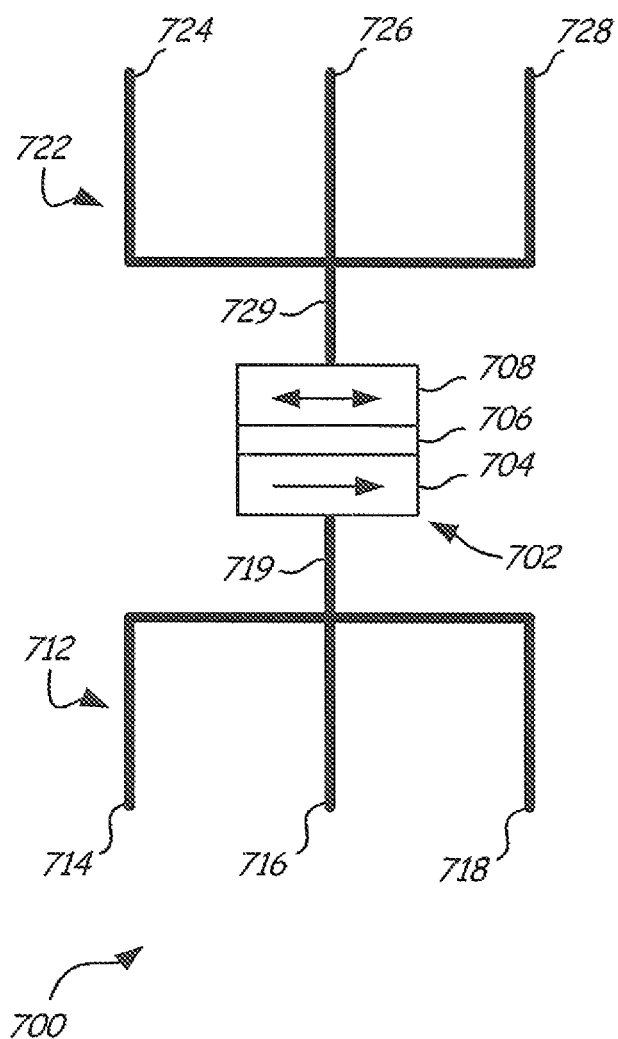
FIG. 7 is a schematic diagram of a one MTJ logic device.

FIG. 7 is a schematic diagram of a three-input MTJ logic device 700. As will be described in greater detail later, device 700 can be used as a building block to create other MTJ devices that enable MTJs to communicate directly with each other.

Device 700 includes a MTJ 702 having a fixed layer 704, a nonmagnetic layer 706, and a free layer 708. A first electrode 712 is electrically connected to fixed layer 704, and a second electrode 722 is electrically connected to free layer 708. The first electrode 712 includes three input terminals 714, 716, and 718 that combine at electrical branch 719. Each input terminal 714, 716, and 718 is configured to receive a current as in input. Similarly, the second electrode 722 includes three input terminals 724, 726, and 728 that combine at electrical branch 729, and that each input terminal is configured to receive a current as an input.

FIG. 8 is a table 800 that illustrates some logic functions that can be performed utilizing device 700 in FIG. 7. Column 802 identifies the logic function being performed. Table 800 shows the operation of device 700 for the OR and AND functions. Device 700 can also be used to perform other functions such as NAND, NOR, and majority functions. These other functions will be described following the description of FIG. 8.

Columns 804, 806, and 808 show the input currents to terminals 714, 716, and 718, respectively. In an embodiment, a positive current, +I, corresponds to logic state-1, and a negative current, −I, corresponds to logic state-0. For example, the first row of values in table 800 (i.e. row 851) illustrates a situation in which a positive current of +I is applied to each of the terminals 714, 716, and 718. This situation corresponds to each of the input terminals having a logic state of 1.

Column 810 shows the net current flowing through the MTJ. In an embodiment, for the OR and AND functions, the terminals 724, 726, and 728 are grounded. Accordingly, the net current flowing through the MTJ is the sum of the currents at terminals 714, 716, and 718. For example, for the first row 851 where each of the three input terminals has an input of +I, the net current through the MTJ is +3I.

Column 812 shows the output resistance of the MTJ. A high resistance illustratively corresponds to logic state-1, and a low resistance illustratively corresponds to logic state-0. In an embodiment, the threshold current for switching the resistance of the MTJ is less than the current, I, that is utilized as the input current. Accordingly, when the net current 810 is +I or +3I, the resistance of the MTJ will either be maintained at or switched to the high resistance state. When the net current 810 is −I or −3I, the resistance of the MTJ will either be maintained at or switched to the low resistance state.

In an embodiment, the input to terminal 718 (i.e. column 808) acts as a control signal that determines whether the device performs the OR function or the AND function. When terminal 718 has an input of +I/logic state-1, the device performs the OR function, and when terminal 718 has an input of −I/logic state-0, the device performs the AND function. The OR and AND functions are illustratively performed on the inputs to terminals 714 and 716 (i.e. the states in columns 804 and 806), and the result of the function is output as a resistance of the MTJ (i.e. the states in column 812). For example, in the first four rows 851-854, the OR function is applied to the inputs in columns 804 and 806 to generate the outputs in column 812. In the last four rows 856-859, the AND function is applied to the inputs in columns 804 and 806 to generate the outputs in column 812.

As previously mentioned, device 700 in FIG. 7 can also be used to perform the majority, NOR, and NAND functions. The majority function can illustratively be performed by utilizing all three of the terminals of one of the electrodes as inputs, and grounding the three terminals of the other electrode. For example, in FIG. 8, if the states in the three columns 804, 806, and 808 are utilized as inputs, then the output in column 812 corresponds to performing the majority function on the three inputs. Accordingly, device 700 can be used to perform the majority function. The NOR and NAND functions can be realized by utilizing terminals 724, 726, and 728 as inputs that receive currents, and grounding terminals 714, 716, and 718.

Figure 9:
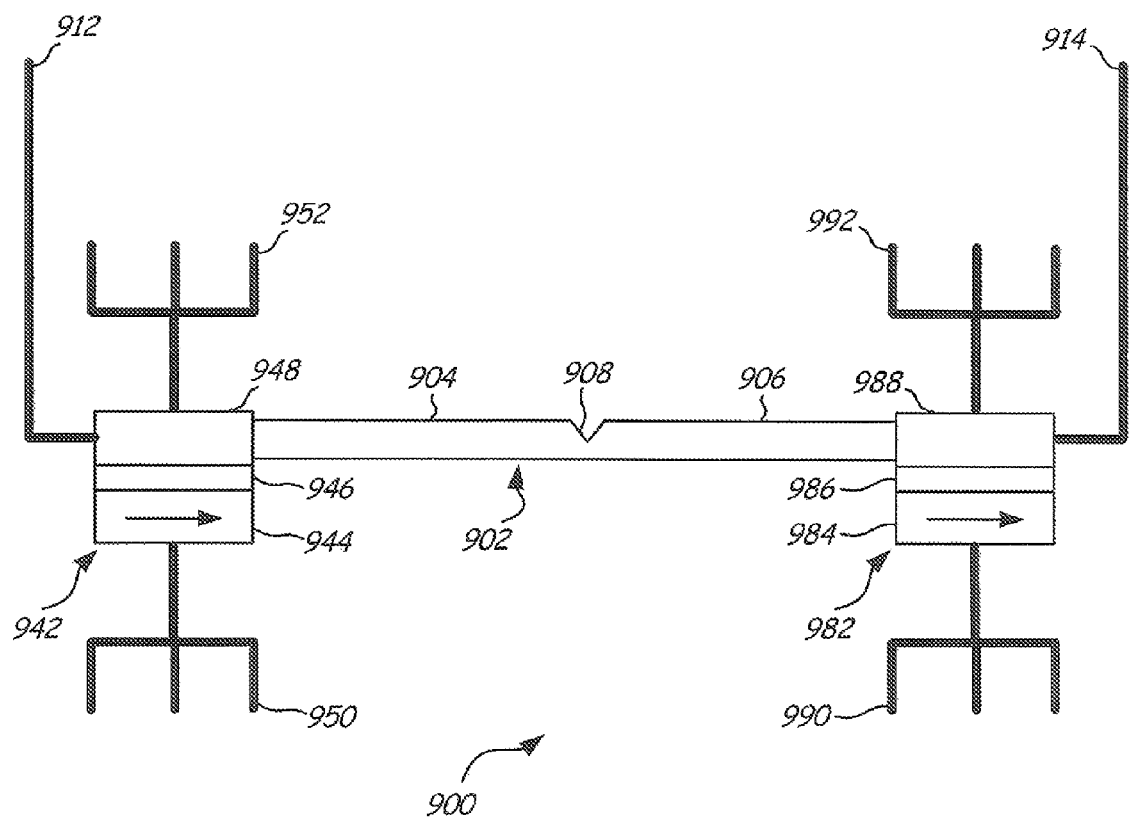
FIG. 9 is a schematic drawing of a device that connects two MTJs utilizing a nano-magnetic channel.

FIG. 9 is a schematic drawing of a device 900 that connects two MTJs utilizing a nano-magnetic channel 902. The nano-magnetic channel 902 illustratively enables logic state information to be transferred directly between the two MTJs 942 and 982 without the need for any intermediate circuitry. In an embodiment, MTJs 942 and 982 are optionally three-input MTJ logic devices such as the one shown in FIG. 7. Embodiments are not however limited to any particular configuration of MTJs, and embodiments can be implemented utilizing other MTJ configurations.

MTJ 942 includes a fixed layer 944, a nonmagnetic layer 946, a free layer 948, a first three terminal electrode 950, and a second three terminal electrode 952. Similarly, MTJ 982 includes a fixed layer 984, a nonmagnetic layer 986, a free layer 988, a first three terminal electrode 990, and a second three terminal electrode 992. In an embodiment, fixed layers 944 and 984 have the same magnetic orientation as each other, and both layers have in-plane magnetic anisotropy. However, some embodiments may have perpendicular magnetic anisotropy instead.

Nano-magnetic channel 902 illustratively has a first portion 904, a second portion 906, and a notch 908. First portion 904 connects to the free layer 948 of MTJ 942 and extends to the notch 908. Second portion 906 connects to the free layer 988 of MTJ 982 and extends to notch 908. Nano-magnetic channel 902 may be made from a same or similar magnetic material as free layers 948 and 988 (e.g. CoFeB).

Device 900 also includes a first channel electrode 912 and a second channel electrode 914. Electrode 912 is electrically connected to free layer 948 of MTJ 942, and electrode 914 is electrically connected to free layer 988 of MTJ 982. In an embodiment, electrodes 912 and 914 are utilized to pass an electric current from one of the MTJ free layers 948/988 through the nano magnetic channel 902 to the other MTJ free layer 948/988.

Figure 10:
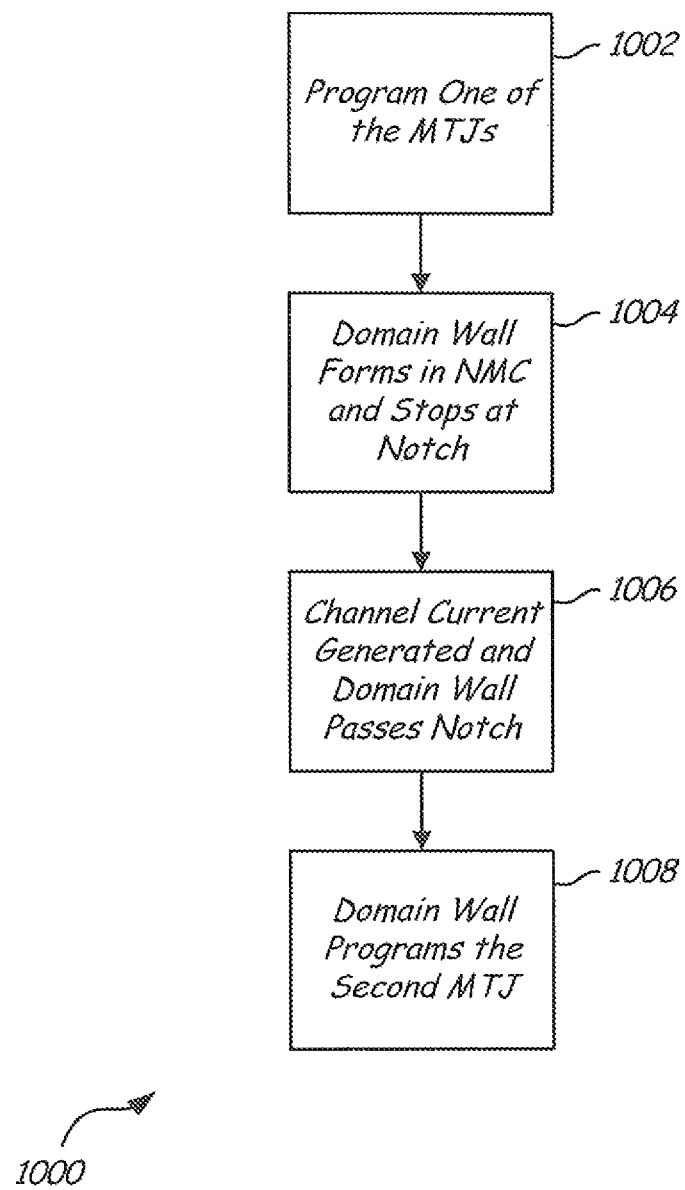
FIG. 10 is a process flow diagram of a method of operating the two MTJ device in FIG. 9.

FIG. 10 is a process flow diagram of a method 1000 of operating device 900 in FIG. 9. At block 1002, one of the MTJs 942 or 982 is programmed. The MTJ can be programmed for example using the techniques illustrated in FIGS. 7-8. As a result of the programming, the free layer 948 or 988 of the programmed MTJ will either be parallel or antiparallel to its corresponding fixed layer.

When the magnetic orientations of the two free layers 948 and 988 are different, a domain wall is illustratively formed in the nano-magnetic channel 902. The domain wall begins at the end of the nano-magnetic channel connected to the programmed MTJ and moves along the channel towards the notch. The notch acts as a strong pinning site for the domain wall movement, and at block 1004, the domain wall stops at the notch. For example, if MTJ 942 is programmed at block 1002, the domain wall will move from free layer 948 through channel portion 904 and stop at notch 908. If MTJ 982 is programmed at block 1002, the domain wall will move from free layer 988 through channel portion 906 and stop at notch 908.

At block 1006, a channel current is passed through the nano-magnetic channel 902 utilizing electrodes 912 and 914. If the channel current is greater than a threshold current, the domain wall is able to pass the notch 908, and the domain wall moves through the channel towards the other MTJ 942 or 982 (i.e. towards the MTJ not programmed at block 1002). If however the channel current is not greater than the threshold current (e.g. if no channel current is applied), then the domain wall is not able to pass the notch 908.

Assuming that the channel current is greater than the threshold current, then at block 1008, the domain wall moves into and programs the second MTJ. Accordingly, at the conclusion of block 1008, both of the MTJs 942 and 982, and the entire nano-magnetic channel 902 will have the same magnetic orientation. Therefore, any logic data programmed into the first MTJ (e.g. logic state-0 or logic state-1) is directly transferred into the second MTJ without the need for any intermediate circuitry.

Figure 11:
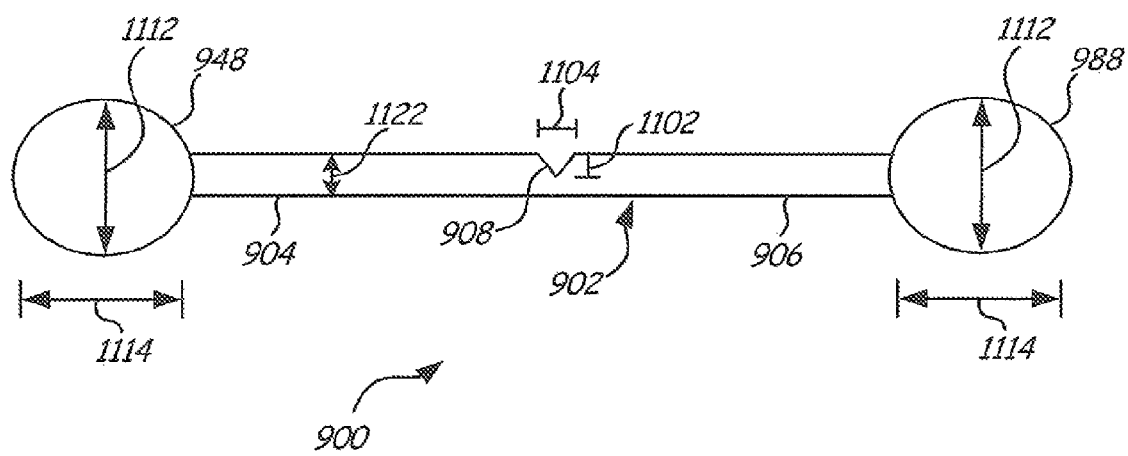
FIG. 11 is a top down view of the two MTJ device in FIG. 9.

FIG. 11 is a top down view of device 900 from FIG. 9. As can be seen in FIG. 11, notch 908 illustratively has a triangular shape with a width 1102 and a length 1104. The pinning potential of the notch, and thus the threshold current of the channel, are illustratively tunable by altering the shape and size of the notch 908. A larger notch 908 is able to more readily stop the propagation of a domain wall, but makes it more difficult for the domain wall to break away. In one particular embodiment, for illustration purposes only and not by limitation, notch 908 has a width 1102 of 6 nm, and a length 1104 of 15 nm. Embodiments are not however limited to any particular shapes and/or sizes.

Furthermore, free layers 948 and 988 illustratively have elliptical shapes with widths 1112 and lengths 1114, and channel 902 has a rectangular shape with a width 1122. The optimization of widths 1112 and lengths 1114 are optionally based on two criteria. The first criterion is thermal stability, which may be satisfied by setting the aspect ratio to 1.4. The second criterion is to minimize the current required to switch the magnetic orientation of the free layers 948 and 988. Reducing the area of layers 948 and 988 generally reduces the switching current. In one embodiment, switching current was reduced until width 1112 was 50 nm, and length 1114 was 70 nm. Accordingly, in one implementation, dimensions of 50 nm by 70 nm are used.

The channel width 1122 illustratively affects the ability to form a domain wall. For example, it may be easier to form a domain wall as channel width 1122 increases. However, a larger width 1122 also makes it more difficult to drive the domain wall to the other MTJ. In at least certain embodiments, it has been found that an optimized strip width 1122 is half the free layer width 1112 based on the current required to form, drive, and inject the domain wall. However, it is worth highlighting again that embodiments are not limited to any particular shapes and/or sizes, and that the information above is given for illustration purposes only.

Figure 12:
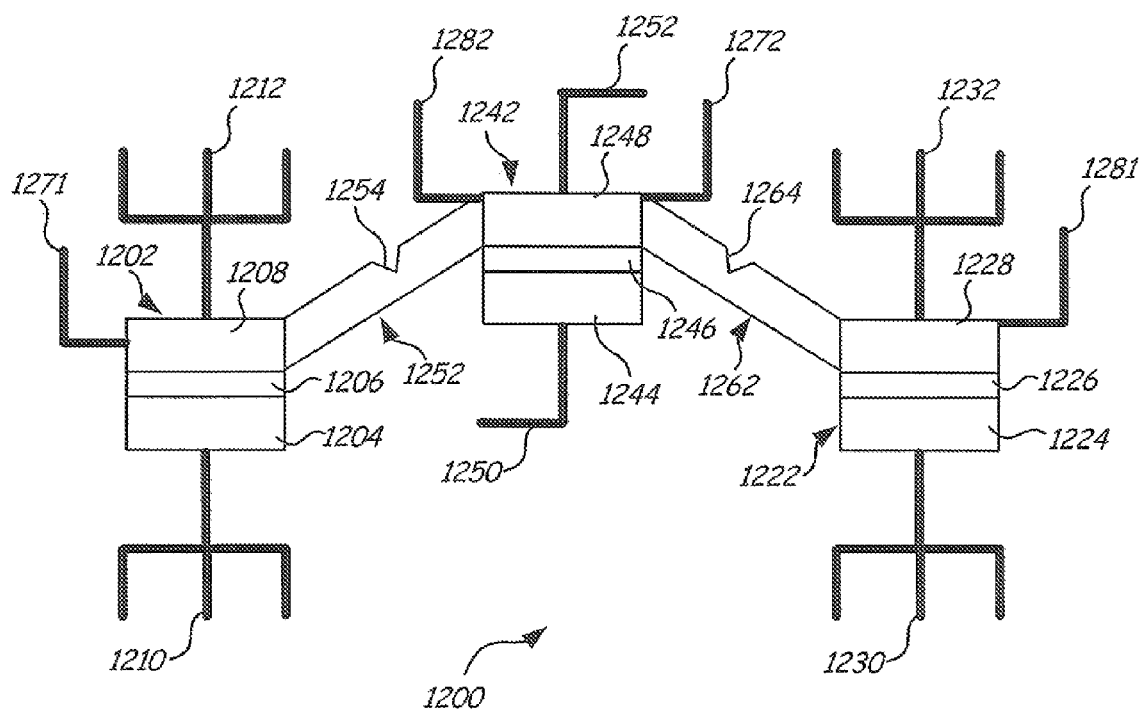
FIG. 12 is a schematic drawing of a device that connects three MTJs utilizing two nano-magnetic channels.

FIG. 12 is a schematic drawing of a device 1200 that connects three MTJs utilizing two nano-magnetic channels 1252 and 1262. In an embodiment, the outer MTJs 1202 and 1222 are the programmable inputs of a logic unit, and the middle MTJ 1242 is the output of the logic unit. The outer MTJs 1202 and 1222 are illustratively only connected with the local output via the nano-magnetic channels, while the middle MTJ 1242 is connected to other components of a circuit utilizing electrodes 1250 and 1252.

MTJs 1202 and 1222 are optionally three-input MTJ logic devices such as the one shown in FIG. 7. MTJ 1202 includes a fixed layer 1204, a nonmagnetic layer 1206, a free layer 1208, a first three terminal electrode 1210, and a second three terminal electrode 1212. Similarly, MTJ 1222 includes a fixed layer 1224, a nonmagnetic layer 1226, a free layer 1228, a first three terminal electrode 1230, and a second three terminal electrode 1232. MTJ 1242 includes a fixed layer 1244, a nonmagnetic layer 1246, and a free layer 148. Additionally, as previously mentioned, MTJ 1242 may have two electrodes 1250 and 1252 that connect the MTJ to other components of a circuit. In an embodiment, fixed layers 1204, 1224, and 1244 have the same magnetic orientation as each other, and have perpendicular magnetic anisotropy. However, some embodiments may have in-plane magnetic anisotropy instead.

Nano-magnetic channel 1252 connects the free layer 1208 of MTJ 1202 to the free layer 1248 of MTJ 1242, and nano-magnetic channel 1262 connects the free layer 1228 of MTJ 1222 to the free layer 1248 of MTJ 1242. As will be described below in greater detail, free layer 1248, nano-magnetic channel 1252, and nano-magnetic channel 1262 may be formed as one structure. Each channel 1252 and 1264 has a notch 1254 and 1264, respectively.

Device 1200 also includes a first set of channel electrodes 1271 and 1272, and a second set of channel electrodes 1281 and 1282. Electrode 1271 is electrically connected to free layer 1208 of MTJ 1202, and electrode 1272 is electrically connected to free layer 1248 of MTJ 1242. In an embodiment, electrodes 1271 and 1272 are utilized to pass an electric current from free layer 1208 through the nano-magnetic channel 1252 to the other free layer 1248. Similarly, electrode 1281 is electrically connected to free layer 1228 of MTJ 1222, and electrode 1282 is electrically connected to free layer 1248 of MTJ 1242. Electrodes 1281 and 1282 are utilized to pass an electric current from free layer 1228 through the nano-magnetic channel 1262 to the other free layer 1248.

Figure 13:
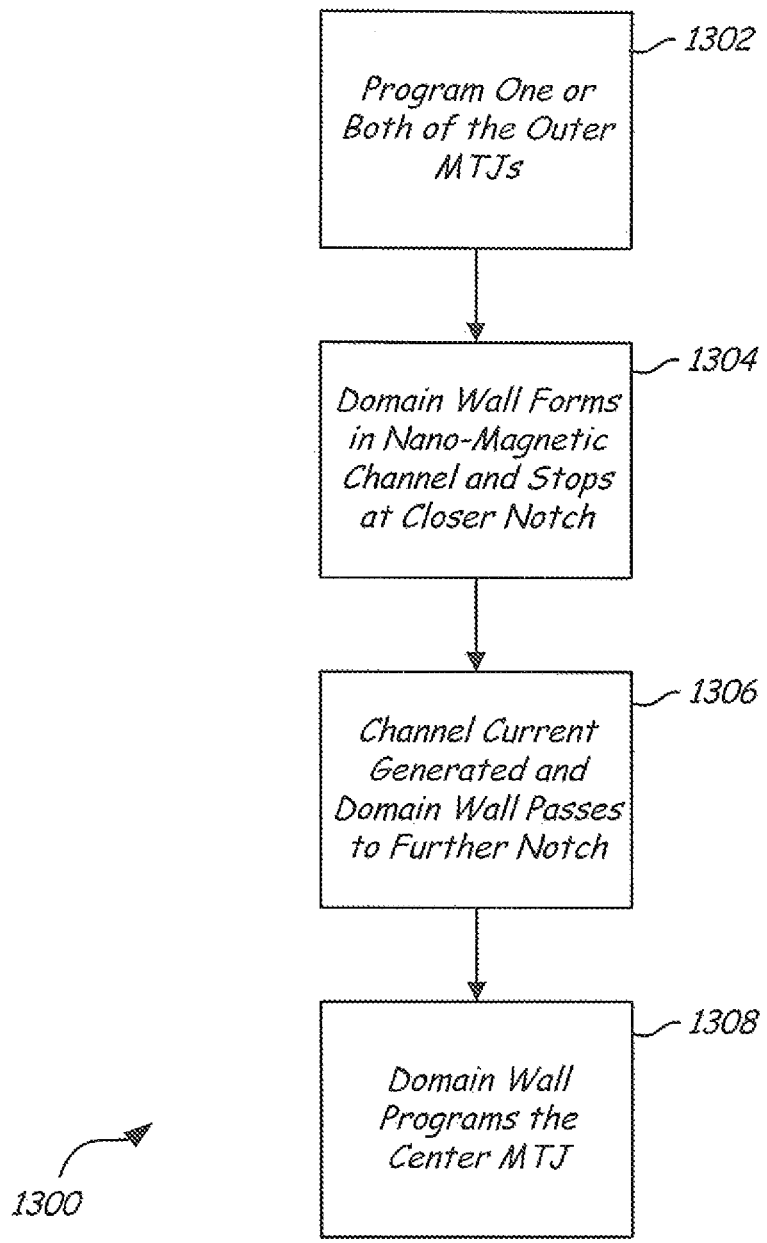
FIG. 13 is a process flow diagram of a method of operating the three MTJ device in FIG. 12.

FIG. 13 is a process flow diagram of a method 1300 of operating device 1200 in FIG. 12. At block 1302, one or both of the outer MTJs 1202 and 1222 are programmed. Again, the MTJs can be programmed using the techniques illustrated in FIGS. 7-8. As a result of the programming, the free layer 1208 and/or 1228 of the programmed MTJ will either be parallel or antiparallel to its corresponding fixed layer.

When the magnetic orientation of either one of the outer MTJ free layers 1208 and 1228 is different than the inner MTJ free layer 1248, a domain wall is illustratively formed in the nano-magnetic channel. At block 1304, the domain wall stops at the closer notch. For example, if MTJ 1202 is programmed and the magnetic orientation of its free layer is different than the magnetic orientation of the free layer of the center MTJ 1242, then a domain wall will form in nano-magnetic channel 1252, and it will stop at notch 1254. Also for example, if MTJ 1222 is programmed and the magnetic orientation of its free layer is different than the magnetic orientation of the free layer of the center MTJ 1242, then a domain wall will form in nano-magnetic channel 1262, and it will stop at notch 1264.

At block 1306, a channel current is generated utilizing either the first set of electrodes 1271 and 1272, or the second set of electrodes 1281 and 1282. Assuming that the channel current is greater than the threshold current, the domain wall will move past the present notch and stop at the further notch. For example, if a channel current is generated utilizing the first set of electrodes 1271 and 1272, a domain wall will move from notch 1254 to notch 1264. If a channel current is generated utilizing the second set of electrodes 1281 and 1282, a domain wall will move from notch 1264 to notch 1254.

At block 1308, assuming that the domain wall has moved from the closer notch to the further notch, the center MTJ 1242 has now been programmed with the logic data (e.g. logic state-0 or logic state-1) that was programmed into the outer MTJ. Therefore, any logic data programmed into either one of the outer MTJs 1202 or 1222 can be directly transferred into the center MTJ 1242 without the need for any intermediate circuitry.

Figure 14:
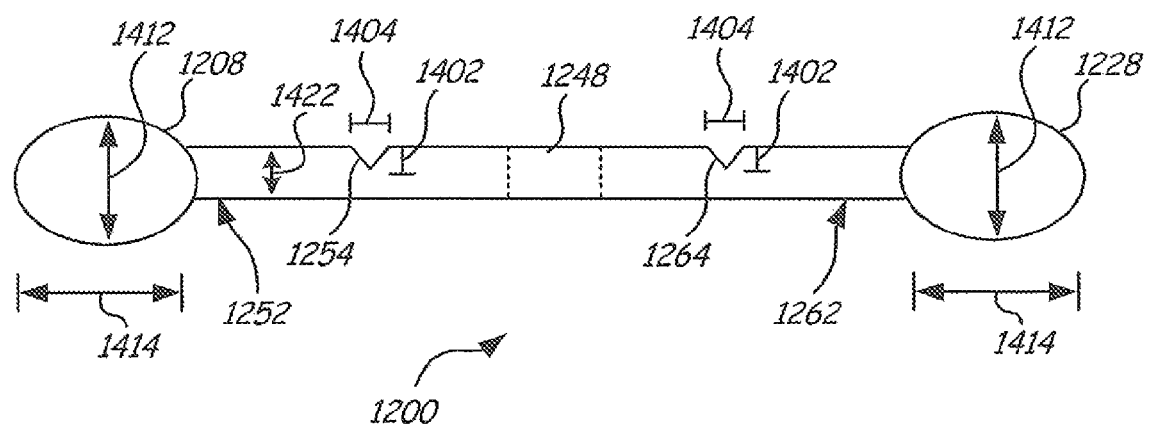
FIG. 14 is a top down view of the three MTJ device in FIG. 12.

FIG. 14 is a top down view of device 1200 from FIG. 12. In one embodiment, nano-magnetic channel 1252, nano-magnetic channel 1262, and center MTJ free layer 1248 are made as one structure, and have a common width 1422. In one embodiment, this may help minimize the channel current needed to move a domain wall from one notch 1254/1264 to the other notch 1254/1264. In one specific implementation, width 1422 is 25 nm, which is half the width 1412 of the outer MTJ free layers 1208 and 1228.

Similar to device 900 in in FIG. 9, notches 1254 and 1264 illustratively have triangular shapes with widths 1402 and lengths 1404, and free layers 1208 and 1228 have elliptical shapes with widths 1412 and lengths 1414. In one particular embodiment, notches 1254 and 1264 have widths 1402 of 15 nm, and lengths 1404 of 6 nm. Free layers 1208 and 1228 have widths 1412 of 50 nm, and lengths 1414 of 70 nm. Embodiments are again however not limited to any particular shapes and/or sizes.

Figure 15:
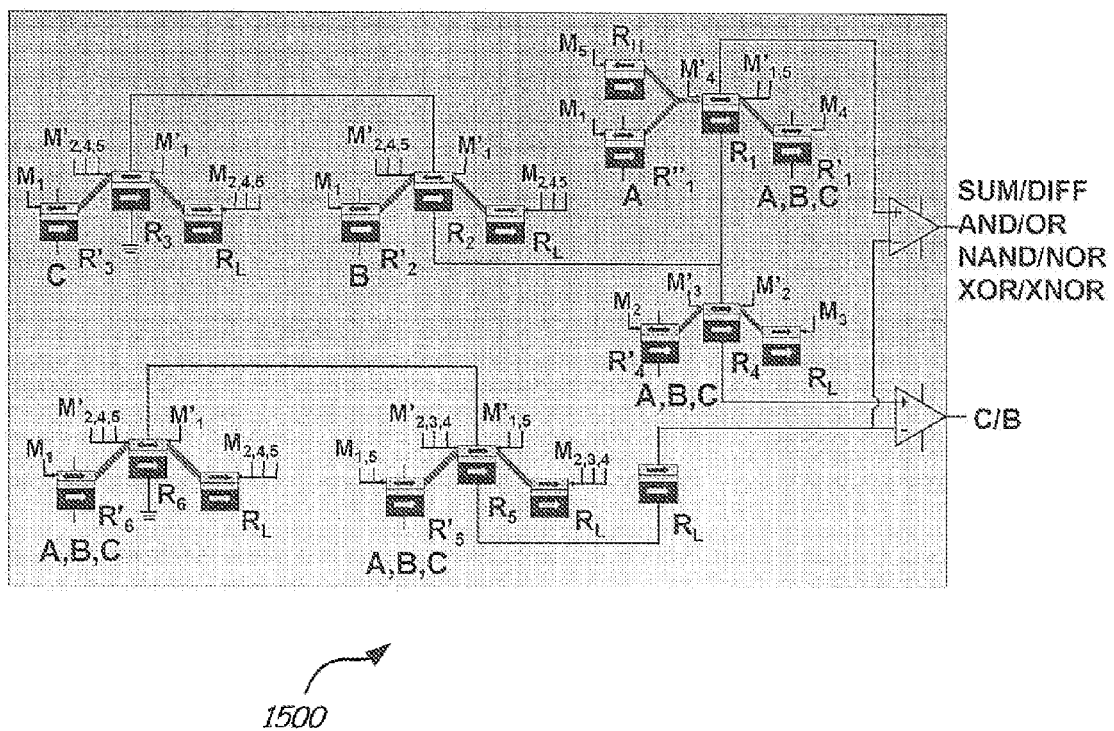
FIG. 15 is a schematic diagram of an arithmetic logic unit that utilizes MTJ devices and nano-magnetic channels.

FIG. 15 is a schematic diagram of an arithmetic logic unit (ALU) 1500 that utilizes some of the MTJ devices and nano-magnetic channels discussed above. ALUs are fundamental building blocks of central processing units of computers that can perform basic operations such as addition, subtraction, AND, NOR, OR, and XOR. ALU 1500 has six basic logic units that are constructed using twenty MTJs and two sense amplifiers. The sense amplifiers are used to convert the signal from a resistance into a voltage signal, which is compatible with the inputs of the next circuit.

The main MTJs in each logic unit are labeled $R_1$, $R_2$, $R_3$, $R_4$, $R_5$, and $R_6$. The status of each main MTJ is controlled through nano-magnetic channels by the input MTJs $R_1'$, $R_1''$, $R_2'$, $R_3'$, $R_4'$, $R_5'$, and $R_6'$, and/or by the reference MTJs $R_L$ and $R_H$. The input MTJs $R_1'$, $R_1''$, $R_2'$, $R_3'$, $R_4'$, $R_5'$, and $R_6'$ are controlled by one or more current inputs A, B, and C, and the reference MTJs $R_L$ and $R_H$ have fixed low and high resistances, respectively. Each nano-magnetic channel is controlled by one or more control signals $M_1$-$M_1'$, $M_2$-$M_2'$, $M_3$-$M_3'$, $M_4$-$M_4'$, and $M_5$-$M_5'$.

FIG. 16 is a table that summarizes the settings of the inputs and control signals for performing operations utilizing ALU 1500. Column 1602 lists the operation that is being performed in each row. ALU 1500 is illustratively able to perform the SUM, DIFF, CARRY, BORROW, AND, OR, NAND, NOR, XOR, and XNOR operations. Columns 1604, 1606, and 1608 list the logic states for inputs A, B, and C, respectively. A "1" corresponds to a positive current being applied to the input, and a "0" corresponds to a negative current being applied to the input. A table entry of "1/0" means that the input is an active input for the operation, and that either a positive current or a negative current can be applied to the input.

Columns 1610, 1612, 1614, 1616, and 1618 list the states of the control signals $M_1$-$M_1'$, $M_2$-$M_2'$, $M_3$-$M_3'$, $M_4$-$M_4'$, and $M_5$-$M_5'$, respectively. A "1" corresponds to the control signal being on (i.e. the current being applied to the channel), and a "0" corresponds to the control signal being off (i.e. the current not being applied to the channel).

For example, the first two rows 1622 and 1624 show the inputs and control signals for performing the SUM and DIFF functions, respectively. As can be seen in columns 1604, 1606, and 1608, all three inputs A, B, and C are active inputs that are utilized for the SUM and DIFF operations. Additionally, as can be seen in columns 1610, 1612, 1614, 1616, and 1618, the control signal $M_1$-$M_1'$ is on, while the rest of the control signals are off.

The rest of the table entries can be read similarly. For example, row 1630 shows the inputs and control signals for performing the AND operation. For the AND operation, the A and B inputs in columns 1604 and 1606 are the active inputs, and the C input is set to "0" (i.e. a negative current is applied to the C input). Additionally for the AND operation, as can be seen in columns 1610, 1612, 1614, 1616, and 1618, the control signal $M_4$-$M_4'$ is on, while the other control signals are off.

Figure 17:
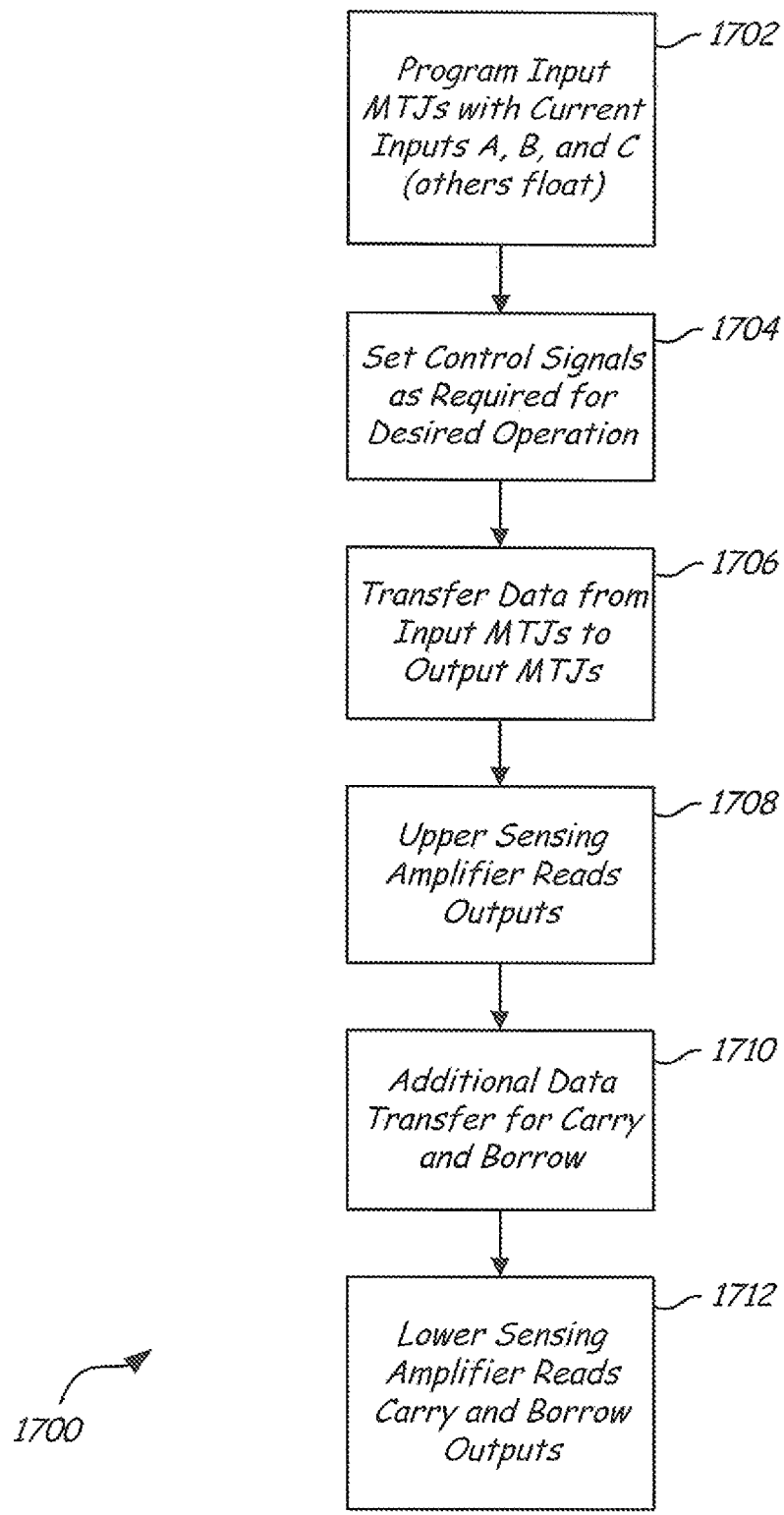
FIG. 17 is a process flow diagram of a method of operating the arithmetic logic unit in FIG. 15.

FIG. 17 is a process flow diagram of a method 1700 of operating ALU 1500 in FIG. 15. At block 1702, the input MTJs (e.g. $R_1'$, $R_1''$, $R_2'$, $R_3'$, $R_4'$, $R_5'$, and $R_6'$) are programmed by the current inputs A, B, and C while the other electrodes are floating. At block 1704, the appropriate control signals as indicated in FIG. 16 are turned on. At block 1706, data is transferred from the input MTJs to the output MTJs in each logic unit (e.g. $R_1$, $R_2$, $R_3$, $R_4$, $R_5$, and $R_6$). At block 1708, the upper sensing amplifier reads the final output for the operations SUM, DIFF, XOR, XNOR, AND, OR, NAND, and NOR. For the CARRY and BORROW operations, the additional steps in blocks 1710 and 1712 are also needed. At block 1710, an additional data transfer step is performed that is controlled by turning on the control signal only. After that, at block 1712, the lower sense amplifier is turned on to read the output. These two additional steps for CARRY and BORROW could however be eliminated by increasing the number of MTJs in the ALU.

In another embodiment, a MTJ device includes a first electrode connected to a free layer of a first magnetic tunnel junction. A second electrode is connected to a free layer of a second magnetic tunnel junction. The first and the second electrodes are configured to pass an electric current through the nano-channel. The nano-channel illustratively comprises one or more of non-magnetic grapheme, metal (e.g. Cu, Ag), semiconductor materials (e.g. ZnO, Si), or diluted magnetic semiconductor materials (e.g. ZnO—Co, ZnO—C, etc.).

In yet another embodiment, a device includes a first giant magnetoresistive (GMR) device having a free layer, a non-magnetic layer, and a fixed layer. The device may also include a second giant magnetoresistive (GMR) device having a free layer, a nonmagnetic layer, and a fixed layer. Additionally, the device may have a nano-magnetic channel that connects the free layer of the first GMR device to the free layer of the second GMR.

As has been described above, embodiments of the present disclosure include systems and methods for direct communication between magnetic tunnel junctions (MTJs). In a first embodiment, two or three MTJs are connected in parallel, and the output of the two or three MTJs is directly connected in series to another MTJ. In a second embodiment, MTJs are directly connected utilizing a nano-magnetic channel. Accordingly, embodiments enable MTJs to communicate directly without the need for intermediate circuitry such as sensing amplifiers. This may help reduce integration complexity, power consumption, area, and delay overheads in MTJ devices. Embodiments may also provide other benefits such as, but not limited to, providing non-volatile memory, combining logic and memory functions in one circuit, and simplifying fabrication.

Finally, it is to be understood that even though numerous characteristics and advantages of various embodiments have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A device comprising:
   multiple input magnetic tunnel junctions connected in parallel; and
   an output magnetic tunnel junction connected in series to the input magnetic tunnel junctions.

2. The device of claim 1, and further comprising:
   a first electrode that is connected to the input magnetic tunnel junctions;
   a second electrode that is connected to the input magnetic tunnel junctions and the output magnetic tunnel junction; and
   a third electrode that is connected to the output magnetic tunnel junction.

3. The device of claim 1, wherein the electrodes are configured to apply a bias voltage across the magnetic tunnel junctions.

4. The device of claim 3, wherein the bias voltage is configured to generate an electric current that flows through the output magnetic tunnel junction.

5. The device of claim 4, wherein a magnetic orientation of a free layer of the output magnetic tunnel junction is configured to be switched when the electric current exceeds a threshold current.

6. The device of claim 1, and further comprising:
   a current mirror that is configured to fan-out to multiple output magnetic tunnel junctions.

7. A device comprising:
   a first magnetic tunnel junction having a free layer, a nonmagnetic layer, and a fixed layer;
   a second magnetic tunnel junction having a free layer, a nonmagnetic layer, and a fixed layer; and
   a nano-magnetic channel that connects the free layer of the first magnetic tunnel junction to the free layer of the second magnetic tunnel junction.

8. The device of claim 7, wherein the nano-magnetic channel includes a notch that acts as a pinning site for domain wall movement.

9. The device of claim 7, wherein the free layer of the first magnetic tunnel junction, the free layer of the second magnetic tunnel junction, and the nano-magnetic channel are made from a same material.

10. The device of claim 7, and further comprising:
    a first electrode connected to the free layer of the first magnetic tunnel junction;
    a second electrode connected to the free layer of the second magnetic tunnel junction; and
    wherein the first and the second electrodes are configured to pass an electric current through the nano-magnetic channel.

11. The device of claim 7, and further comprising:
    a third magnetic tunnel junction having a free layer, a nonmagnetic layer, and a fixed layer; and
    a second nano-magnetic channel that connects the free layer of the second magnetic tunnel junction to the free layer of the third magnetic tunnel junction.

12. The device of claim 11, wherein the free layer of the second magnetic tunnel junction has a same width as the nano-magnetic channels.

13. The device of claim 7, wherein one or more of the first magnetic tunnel junction, the second magnetic tunnel junction, and the nano-magnetic channel comprises in-plane magnetic anisotropy.

14. The device of claim 7, wherein one or more of the first magnetic tunnel junction, the second magnetic tunnel junction, and the nano-magnetic channel comprises perpendicular magnetic anisotropy.

15. A method comprising:
    connecting multiple input magnetic tunnel junctions in parallel; and
    connecting an output magnetic tunnel junction in series to the multiple input magnetic tunnel junctions.

16. The method of claim 15, and further comprising:
    applying a voltage across the input and the output magnetic tunnel junctions to generate an electric current that passes through the output magnetic tunnel junction.

17. The method of claim 16, and further comprising:
    switching a magnetic orientation of a free layer of the output magnetic tunnel junction based on the electric current exceeding a threshold current.

18. The method of claim 15, and further comprising:
    presetting a magnetic orientation of a free layer of the output magnetic tunnel junction.

19. The method of claim 15, and further comprising:
    programming each of the input magnetic tunnel junctions to either a low resistance state or a high resistance state.

20. The method of claim 15, and further comprising:
    utilizing a current mirror to fan-out to multiple output magnetic tunnel junctions.

21. The device of claim 7, and further comprising:
    a first electrode connected to the free layer of the first magnetic tunnel junction;
    a second electrode connected to the free layer of the second magnetic tunnel junction; and wherein the first and the second electrodes are configured to pass an electric current through the nanochannel that is made from a material that is selected from the group consisting of non-magnetic graphene, metal, semiconductor materials, and diluted magnetic semiconductor materials.

22. A device comprising:
a first giant magnetoresistive (GMR) device having a free layer, a nonmagnetic layer, and a fixed layer;
a second giant magnetoresistive (GMR) device having a free layer, a nonmagnetic layer, and a fixed layer; and
a nano-magnetic channel that connects the free layer of the first GMR device to the free layer of the second GMR.

* * * * *